United States Patent
Huber et al.

(10) Patent No.: US 9,696,632 B2
(45) Date of Patent: Jul. 4, 2017

(54) MIRROR FOR THE EUV WAVELENGTH RANGE, METHOD FOR PRODUCING SUCH A MIRROR, AND PROJECTION EXPOSURE APPARATUS COMPRISING SUCH A MIRROR

(71) Applicant: Carl Zeiss SMT GMBH, Oberkochen (DE)

(72) Inventors: Peter Huber, Holzschwang (DE); Gisela Von Blanckenhagen, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 298 days.

(21) Appl. No.: 14/478,535

(22) Filed: Sep. 5, 2014

(65) Prior Publication Data

US 2015/0055108 A1 Feb. 26, 2015

Related U.S. Application Data

(63) Continuation of application No. PCT/EP2013/000663, filed on Mar. 6, 2013.
(Continued)

(30) Foreign Application Priority Data

Mar. 8, 2012 (DE) .................. 10 2012 203 633

(51) Int. Cl.
*G03B 27/54* (2006.01)
*G03F 7/20* (2006.01)
(Continued)

(52) U.S. Cl.
CPC .............. *G03F 7/702* (2013.01); *B82Y 10/00* (2013.01); *C23C 14/06* (2013.01); *C23C 14/35* (2013.01);
(Continued)

(58) Field of Classification Search
CPC ............ G03F 7/70316; G03F 7/70925; G03F 7/70958
(Continued)

(56) References Cited

U.S. PATENT DOCUMENTS 6,160,867 A 12/2000 Murakami
7,193,228 B2 3/2007 Bowering et al.
(Continued)

FOREIGN PATENT DOCUMENTS

CN 1868033 A 11/2006
DE 102009054653 A1 6/2011
(Continued)

OTHER PUBLICATIONS

Office Action in corresponding Chinese Application No. 201380013152.9, mailed Feb. 24, 2016, along with an English translation.
(Continued)

*Primary Examiner* — Hung Henry Nguyen
(74) *Attorney, Agent, or Firm* — Edell, Shapiro & Finnan, LLC

(57) ABSTRACT

A mirror (1) for the EUV wavelength range having a reflectivity of greater than 40% for at least one angle of incidence of between 0° and 25° includes a substrate (S) and a layer arrangement, wherein the layer arrangement has at least one non-metallic individual layer (B, H, M), and wherein the non-metallic individual layer (B, H, M) has a doping with impurity atoms of between 10 ppb and 10%, in particular between 100 ppb and 0.1%, providing the non-metallic individual layer (B, H, M) with a charge carrier density of greater than $6*10^{10}$ cm$^{-3}$ and/or an electrical conductivity of greater than $1*10^{-3}$ S/m, in particular with a charge carrier density of greater than $6*10^{13}$ cm$^{-3}$ and/or an electrical conductivity of greater than 1 S/m.

20 Claims, 4 Drawing Sheets

Related U.S. Application Data

(60) Provisional application No. 61/608,229, filed on Mar. 8, 2012.

(51) Int. Cl.
*B82Y 10/00* (2011.01)
*G21K 1/06* (2006.01)
*C23C 14/06* (2006.01)
*C23C 14/35* (2006.01)
*G02B 5/08* (2006.01)

(52) U.S. Cl.
CPC ....... *G02B 5/0891* (2013.01); *G03F 7/70316* (2013.01); *G21K 1/062* (2013.01)

(58) Field of Classification Search
USPC .............................. 355/53, 67; 359/359–360
See application file for complete search history.

(56) References Cited

U.S. PATENT DOCUMENTS

| | | | | |
|---|---|---|---|---|
| 7,920,323 | B2* | 4/2011 | Benoit | B82Y 10/00 359/359 |
| 2001/0038953 | A1 | 11/2001 | Tsukamoto et al. | |
| 2003/0008172 | A1 | 1/2003 | Leclerc et al. | |
| 2006/0192147 | A1 | 8/2006 | Kandaka et al. | |
| 2012/0013976 | A1 | 1/2012 | Weber | |
| 2012/0196208 | A1 | 8/2012 | Mikami et al. | |
| 2012/0212721 | A1 | 8/2012 | Clauss et al. | |
| 2012/0229785 | A1* | 9/2012 | Krivtsun | B82Y 10/00 355/66 |

FOREIGN PATENT DOCUMENTS

| | | |
|---|---|---|
| DE | 102011003357 A1 | 8/2012 |
| EP | 1675164 A1 | 6/2006 |
| JP | 2002313707 A | 10/2002 |
| JP | 2006177740 A | 7/2006 |
| JP | 2007057450 A | 3/2007 |
| JP | 2007528608 A | 10/2007 |
| WO | 2004053540 A1 | 6/2004 |
| WO | 2011020655 A1 | 2/2011 |
| WO | 2011061007 A1 | 5/2011 |
| WO | 2011071126 A1 | 6/2011 |
| WO | 2012104136 A1 | 8/2012 |

OTHER PUBLICATIONS

Office Action in corresponding German Application No. 10 2012 203 633.4, mailed Oct. 4, 2012, along with an English translation.
International Search Report and Written Opinion in counterpart International Application No. PCT/EP2013/000663, mailed Jul. 5, 2013.
Braun, S. et al., "Mo/Si Multilayers with Different Barrier Layers for Applications as Extreme Ultraviolet Mirrors", Japanese Journal of Applied Physics, vol. 41, Part 1, No. 6B, Jun. 2002, pp. 4074-4081.
Rebollo-Plata, B. et al., "Amorphous Carbon Thin Films Prepared by Electron-Gun Evaporation", AZojomo, Nov. 1, 2005, pp. 1-6.
Office Action in corresponding Japanese Application 2014-560273, mailed Oct. 25, 2016, along with English Translation.
Office Action in corresponding Chinese Application No. 201380013152.9, mailed Aug. 16, 2016, along with an English translation.
Office Action mailed on Nov. 15, 2016, directed to European Patent Office Application No. 13716191.5.

* cited by examiner

MIRROR FOR THE EUV WAVELENGTH RANGE, METHOD FOR PRODUCING SUCH A MIRROR, AND PROJECTION EXPOSURE APPARATUS COMPRISING SUCH A MIRROR

CROSS-REFERENCE TO RELATED APPLICATIONS

This application is a Continuation Application of International Application No. PCT/EP2013/000663, filed on Mar. 6, 2013, which claims benefit under 35 U.S.C 119(e) of U.S. Provisional Application No. 61/608,229, filed Mar. 8, 2012, and which claims priority under 35 U.S.C. §119(a) to German Patent Application No. 10 2012 203 633.4, filed Mar. 8, 2012. The entire disclosures of all three related applications are considered part of and are incorporated by reference into the disclosure of the present application.

FIELD OF AND BACKGROUND OF THE INVENTION

The invention relates to a mirror for the EUV wavelength range and to a method for producing such a mirror. Furthermore, the invention relates to an EUV light source, an EUV illumination system and an EUV projection lens for microlithography comprising such a mirror. Moreover, the invention relates to a projection exposure apparatus for microlithography.

Projection exposure apparatuses for microlithography for the EUV wavelength range have to rely on the assumption that the mirrors used for the exposure or imaging of a mask into an image plane have a high reflectivity since, firstly, the product of the reflectivity values of the individual mirrors determines the total transmission of the projection exposure apparatus and since, secondly, the light power of EUV light sources is limited. In this case, the EUV wavelength range is understood to be the wavelength range of light having wavelengths of between 5 nm and 20 nm.

Mirrors for the EUV wavelength range around 13 nm having high reflectivity values are known from DE 101 55 711 A1, for example. The mirrors described therein consist of a layer arrangement which is applied on a substrate and which has a sequence of individual layers, wherein the layer arrangement comprises a plurality of layer subsystems each having a periodic sequence of at least two individual layers of different materials that form a period, wherein the number of periods and the thickness of the periods of the individual subsystems decrease from the substrate toward the surface.

What is disadvantageous about such mirrors, however, is that, over the entire lifetime of an EUV projection exposure apparatus, said mirrors absorb approximately ⅓ of all EUV photons incident on the mirror in the layer arrangement of the mirror. In general, the absorption of the high-energy EUV photons takes place by way of the photoelectric effect, electrons in the solid being ejected. As a consequence thereof, a large number of atoms having destabilized or broken chemical bonds are produced within the layer materials. Such atoms having destabilized bonds can then readily perform a change of site or location on an atomic scale, as a result of which the structure of the affected layer and thus also the optical property thereof changes. In initial experiments for continuous irradiation, a spectral shift of EUV mirrors was already ascertained.

The exact processes on account of the destabilized and broken bonds on an atomic scale are currently unclear. It is conceivable that the layer materials assume a state of increased density, which can explain the spectral shift ascertained. Such processes, described by the term "compaction", are known for quartz glasses and for mirror layers in VUV microlithography with 193 nm. However, it is also conceivable that the destabilized atoms undergo a chemical reaction with atoms from adjacent layers or with atoms from the residual gas atmosphere of the projection exposure apparatus.

As a result of the structural change brought about by the destabilized atoms in the affected layer, the layer stress thereof and the surface roughness thereof also change besides the optical property.

In order to set the layer stress of a mirror, during the production thereof, so-called buffer layers or anti-stress layers (ASL) are usually applied between substrate and reflective coating, which compensate for the compressive stress of the reflective coating with their tensile stress. However, if the stress ratios within the layer arrangement change over the course of time as a result of the destabilized atoms in a mirror, then this inevitably leads to an impermissible change in the shape of the mirror surface. This then gives rise to impermissible image aberrations of the projection exposure apparatus.

In order to avoid stray light losses, mirrors for the EUV wavelength range are provided with very smooth substrate and layer surfaces during production. However, if the destabilized atoms give rise over the course of time to rough interfaces of the layers in the HSFR spatial frequency range, then this leads to stray light losses and thus to a loss of total transmission in a projection exposure apparatus, see U. Dinger et al. "Mirror substrates for EUV-lithography: progress in metrology and optical fabrication technology" in Proc. SPIE Vol. 4146, 2000, in particular for the definition of the surface roughness in the HSFR range with spatial wavelengths of the roughness of 10 nm to 1 μm and in the MSFR range with spatial wavelengths of the roughness of 1 μm to 1 mm.

Furthermore, the destabilized atoms at the interfaces of the layers can also enter into new chemical bonds, as a result of which the interdiffusion of the layers, which already takes place anyway, is intensified and/or as a result of which the effect of the layers used for suppressing the interdiffusion (so-called barrier layer) is reduced. An increased interdiffusion leads to a loss of contrast at the interfaces and this therefore leads to a loss of reflectivity in the mirror overall.

OBJECTS AND SUMMARY OF THE INVENTION

It is an object of the invention to provide a mirror for the EUV wavelength range which has a high long-term stability with regard to its spectral behaviour, its surface shape and its stray light losses.

According to one formulation of the invention, this object is achieved by a mirror for the EUV wavelength range having a reflectivity of greater than 40% for at least one angle of incidence of between 0° and 25°, comprising a substrate and a layer arrangement, wherein the layer arrangement comprises at least one non-metallic individual layer, characterized in that the non-metallic individual layer has a doping with impurity atoms of between 10 ppb and 10%, in particular between 100 ppb and 0.1%, such that a charge carrier density of greater than $6*10^{10}$ cm$^{-3}$ and/or an electrical conductivity of greater than $1*10^{-3}$ S/m, in particular a charge carrier density of greater than $6*10^{13}$ cm$^{-3}$ and/or an electrical conductivity of greater than 1 S/m, are/is afforded for the non-metallic individual layer.

The inventors have recognized that the breaking of chemical bonds by the EUV photons does not per se constitute a problem, rather that only the subsequent change of site or location of the atoms leads to the structural change in the affected non-metallic layer. The above-indicated doping of the affected non-metallic layer with impurity atoms makes it possible, with a sufficiently large number of freely mobile electrons in the affected layer, very rapidly to replace the ejected bonding electrons and to stabilize the atoms even before the latter can perform a change of site or location on an atomic scale. Since metals such as e.g. molybdenum (Mo) or ruthenium (Ru) have a high density of freely mobile electrons, such individual layers composed of metals therefore scarcely tend towards such a structural change. However, e.g. oxides, nitrides and carbides of said metals are non-metallic materials and therefore require a doping with impurity atoms in order to provide a sufficiently high number of free electrons for the radiation resistance.

Furthermore, the provision of free electrons also increases the thermal conductivity of the correspondingly doped layers. This makes it possible for the heat loss of an EUV light pulse, which heat loss is usually deposited in the topmost 30 layers, to be transported away into deeper layers toward the substrate before the next EUV light pulse reaches the mirror and heats the upper layers further. Impermissible permanent heating of the topmost layers of an EUV mirror can thus be prevented, especially since the heat dissipated as far as the substrate can be dissipated through corresponding cooling channels in the substrate and, consequently, the topmost layers can be correspondingly cooled with the aid of the increased thermal conductivity of the doped layers. In this respect, the doping not only increases the radiation resistance of a mirror, but also permanently reduces the thermal loading thereof.

In one embodiment, the layer arrangement comprises at least one layer subsystem which consists of a periodic sequence of at least two periods of individual layers, wherein the periods comprise two individual layers composed of different materials for a high refractive index layer and a low refractive index layer and the doping with impurity atoms of the at least non-metallic individual layer is effected by atoms of at least one element from group V of the periodic system. By virtue of said at least one layer subsystem, the high reflectivity of the mirror for the EUV wavelength range is ensured and the doping with atoms of elements from group V provides for an excess of electrons in the conduction band of the non-metallic individual layer and thus to a stabilization of said individual layer.

In the context of the present invention, a layer subsystem is distinguished from an adjacent layer subsystem, even given otherwise identical division of the periods between high and low refractive index layers, if a deviation by more than 0.1 nm is present as deviation in the thickness of the periods of the adjacent layer subsystems since, given a difference of 0.1 nm, it is already possible to assume a different optical effect of the layer subsystems with otherwise identical division of the periods between high and low refractive index layers.

The terms high refractive index and low refractive index are in this case, in the EUV wavelength range, relative terms with regard to the respective partner layer in a period of a layer subsystem. In the EUV wavelength range, layer subsystems generally function as reflective layer systems only if a layer that acts with optically high refractive index is combined with an optically lower refractive index layer relative thereto as main constituent of a period of the layer subsystem.

In another embodiment, the layer arrangement has a total thickness of less than 200 nm and the high refractive index layers of the layer subsystem have a doping with impurity atoms. The doping of the high refractive index layers of the layer subsystem makes it possible to reduce the compressive stress of the layer subsystem, such that either no further layer subsystem or only a further layer subsystem of reduced thickness is required for stress compensation. For a given division of the periods between high and low refractive index layers, the number of periods determines the total absolute value of the tensile stress of the further layer subsystem for stress compensation. If less tensile stress is required for compensation, the total thickness of the layer arrangement is consequently reduced as well. It is thus possible by virtue of the doping to provide a mirror for the EUV wavelength range having a reflectivity of more than 40% for at least one angle of incidence of between 0° and 25° which has a total layer stress of less than 20 MPa and nevertheless a total thickness of the layer arrangement of less than 200 nm. In particular, this applies to mirrors with virtually normal incidence and a reflectivity of more than 60%.

In a further embodiment, the mirror has, at a location of its optically used surface after irradiation with light from the EUV wavelength range with a close of more than 10 kJ/mm$^2$, an average reflection wavelength within its reflection spectrum of between 12 nm and 14 nm for normal incidence which deviates from the average emission wavelength of the light source between 12 nm and 14 nm by less than 0.25 nm, in particular by less than 0.15 nm. This prevents a decrease in the throughput of wafers in the case of a relatively long operating duration of the projection exposure apparatus as a result of spectral shifts. According to the invention, the doping of the individual layers prevents structural changes and thus changes in the optical properties of the individual layers from being brought about by the radiation. It is thus possible for a mirror, even after the indicated close, to have virtually the same reflection spectrum as at the beginning of irradiation.

In the context of this invention, emission spectrum and average emission wavelength of the light source between 12 nm and 14 nm are understood to be the direct spectrum and the direct average wavelength at the location of light generation. It is only at the location of actual light generation that this spectrum is unambiguous and not corrupted by the properties of optical components. In general, the mirrors of a projection exposure apparatus, starting at the collector mirror of the EUV light source through to the last mirror of the EUV projection exposure apparatus, with regard to their reflecting spectrum, are coordinated with this emission spectrum of the light source for a maximum total transmission of the projection exposure apparatus.

In another embodiment for collector mirrors of an EUV light source and/or mirrors of an EUV illumination system, the deviation of the average reflection wavelength from the average emission wavelength after irradiation with the close indicated above is less than 0.05 nm. This makes it possible to prevent, in particular, relatively large losses in the total transmission by virtue of mirrors that are situated near the light source being made resistant to radiation via the corresponding doping. The nearer to the light source a mirror is positioned, the greater the surface power densities or lifetime effects to which said mirror is generally subjected. This applies particularly to the collector mirror of the EUV light source.

In one embodiment of a mirror according to the invention, the non-metallic individual layer of the layer arrangement consists of materials which are selected or made up as a compound from the group of materials: $B_4C$, C, Zr oxides, Zr nitrides, Si, Si oxides, Si nitrides, Si carbides, Si borides, Mo nitrides, Mo oxides, Mo carbides, Mo borides, Ru oxides, Ru nitrides, Ru carbides and Ru borides. In particular, these materials mentioned tend toward structural changes under EUV radiation and therefore have to be stabilized by a corresponding doping.

In another embodiment of a mirror according to the invention, the two individual layers of the at least one layer subsystem that form a period consist either of the materials molybdenum (Mo) and silicon (Si) or of the materials ruthenium (Ru) and silicon (Si). This makes it possible to achieve particularly high reflectivity values and at the same time to realize production engineering advantages since only two different materials are used for the production of the layer subsystems of the layer arrangement of the mirror. Furthermore, in this embodiment, at least one individual layer composed of silicon has a doping with impurity atoms of between 10 ppb and 10%, in order to protect the mirror against long-term alterations. In a further configuration of this embodiment, all the individual layers composed of silicon of the at least 10 periods, in particular of the at least 5 periods, of the at least one layer subsystem which are the furthest away from the substrate have this doping with impurity atoms for long-term stabilization. In this case, it should be taken into consideration that the intensity of EUV radiation in a layer arrangement is the highest at the capping layer surface and decreases exponentially with increasing penetration depth into the layer arrangement. Therefore, it is appropriate, in particular, to equip at least the upper 5 periods with correspondingly doped layers.

In this case, in a further embodiment, the individual layers are separated by at least one barrier layer, wherein the barrier layer consists of a material which is selected or made up as a compound from the group of materials: $B_4C$, C, Si nitride, Si carbide, Si boride, Mo nitride, Mo carbide, Mo boride, Ru nitride, Ru carbide and Ru boride. Such a barrier layer suppresses the interdiffusion between the two individual layers of a period, thereby increasing the optical contrast in the transition of the two individual layers. With the use of the materials molybdenum and silicon for the two individual layers of a period, one barrier layer above the Si layer, as viewed from the substrate, suffices in order to provide for a sufficient contrast. The second barrier layer above the Mo layer can be dispensed with in this case. In this respect, at least one barrier layer for separating the two individual layers of a period should be provided, wherein the at least one barrier layer may perfectly well be constructed from various ones of the above-indicated materials or the compounds thereof and may in this case also exhibit a layered construction of different materials or compounds.

Barrier layers which comprise the material $B_4C$ and have a thickness of between 0.35 nm and 0.8 nm, preferably between 0.4 nm and 0.6 nm, lead in practice to high reflectivity values of the layer arrangement. Particularly in the case of layer subsystems composed of ruthenium and silicon, barrier layers composed of $B_4C$ exhibit a maximum of reflectivity in the case of values of between 0.4 nm and 0.6 nm for the thickness of the barrier layer.

In a further embodiment, a mirror according to the invention comprises a capping layer system comprising at least one layer composed of a chemically inert material, which terminates the layer arrangement of the mirror toward the vacuum. The mirror is then protected against ambient influences. In this embodiment, the surface roughness of the layer terminating the layer arrangement is less than 0.2 nm rms HSFR, in particular less than 0.1 nm rms HSFR. It is thereby possible to avoid stray light losses.

In another embodiment, the terminating layer of the layer arrangement consists of an oxide and/or nitride and has a doping with impurity atoms with atoms of at least one element from group V of the periodic system. In particular, the doping of capping layers consisting of oxides and/or nitrides prevents the capping layers from having a relatively high surface roughness after relatively long irradiation e.g. with the abovementioned close on account of the structural change. In this case, it should also be taken into consideration that surfaces having a relatively high surface roughness are subjected to the ambient influences of the residual gas atmosphere of an EUV projection exposure apparatus to a greater extent. This in turn can lead to a self-reinforcing effect and make the capping layer unusable.

In a further embodiment, the layer arrangement has at least one further layer subsystem for stress compensation, wherein the further layer subsystem consists of a periodic sequence of at least two periods of individual layers, wherein the periods comprise two individual layers composed of different materials for a high refractive index layer and a low refractive index layer. Such a further layer system makes it possible to prevent an impermissible deformation of the mirror after coating.

In one embodiment, the total layer stress of the layer arrangement is less than 100 MPa, in particular less than 50 MPa, particularly preferably less than 20 MPa. Such a total layer stress makes it possible that, given a typical aspect ratio of mirror diameter to mirror thickness of 5:1, the surface shape of the mirror after coating has been effected deviates from the surface shape of the substrate prior to coating by less than 0.1 nm rms figure. In this case, the tensile stress of the further layer subsystem is less than +240 MPa. Such a low tensile stress for the further layer subsystem arranged between the substrate and the at least one layer subsystem has the advantage that overall fewer periods are required for the further layer subsystem. This results in a higher process stability and a shorter manufacturing time.

In one embodiment, the further layer subsystem has a thickness of the periods of 5 nm or less, in particular of 3.5 nm or less. Such thin periods, even in the case of a high proportion of molybdenum, lead to thin molybdenum layers and thus prevent crystal growth in these layers. It is thereby possible to produce further layer subsystems for stress compensation which have a low surface roughness and thus avoid stray light losses.

In a further embodiment, the reflectivity of a mirror according to the invention with normal incidence is more than 60% and the number of periods of the further layer subsystem is less than 20, in particular less than 15. Such mirrors for virtually normal incidence, i.e. an angle of incidence of less than 5°, are generally embodied as a monostack or only with one layer subsystem and have high compressive forces. The doping of the at least one layer subsystem makes it possible to reduce said compressive forces in such a way that it is possible to limit the number of periods of the further layer subsystem for stress compensation for production.

Furthermore, the object of the present invention according to another formulation is achieved by a method for coating a mirror according to the invention for the EUV wavelength range, wherein a partial pressure of impurity atoms of greater than $10^{-9}$ mbar, in particular of greater than $10^{-7}$ mbar, is present in the coating apparatus during the coating of the at least one non-metallic individual layer. Such an addition of impurity atoms to the residual gas of the coating apparatus during the coating process of the non-metallic individual layer affords a simple and cost-effective possibility for doping.

In one embodiment, the coating of the at least one non-metallic individual layer is performed by magnetron sputtering at a working gas pressure of at least $10^{-4}$ mbar. On account of the high repetition accuracy of this process at higher rates compared with other methods such as e.g. ion beam sputtering or pulsed laser deposition, magnetron sputtering is suitable in particular for the industrial production of EUV layers.

In a further embodiment, as an alternative or in addition to the addition of impurity atoms to the residual gas of the coating apparatus in the method for coating the mirror according to the invention, at least one sputtering target which already has a corresponding doping with impurity atoms of between 10 ppb and 10% is used. In this case, the impurity atoms of the residual gas and the impurity atoms of the sputtering target may perfectly differ.

Furthermore, the object of the invention according to yet another formulation of the invention is achieved by an EUV light source, an EUV illumination system and/or an EUV projection lens comprising at least one mirror according to the invention.

Furthermore, the object of the invention is achieved by a projection exposure apparatus according to the invention for microlithography.

In one embodiment, in this case, the collector mirror for the EUV light source has at least one non-metallic individual layer having a doping with impurity atoms which is higher than the doping with impurity atoms of a non-metallic individual layer of a mirror for the EUV illumination system and/or of a mirror for the EUV projection lens. This limits the necessary doping for long-term stabilization to those components which are permanently subjected to a high surface power density of EUV light. Consequently, doping of all the mirrors of an EUV projection exposure apparatus for microlithography, said doping being complex in terms of production engineering, is prevented and limited to the necessary amount of mirrors.

Correspondingly, in a further embodiment, a mirror for the EUV illumination system has a non-metallic individual layer having a doping with impurity atoms which is higher than the doping with impurity atoms of a non-metallic individual layer of a mirror for the EUV projection lens of the projection exposure apparatus.

Further features and advantages of the invention will become apparent from the following description of exemplary embodiments of the invention with reference to the figures, which show details essential to the invention, and from the claims. The individual features can be realized in each case individually by themselves or as a plurality in any desired combination in a variant of the invention.

BRIEF DESCRIPTION OF THE DRAWINGS

Exemplary embodiments of the invention are illustrated in greater detail below with reference to the figures, in which.

DETAILED DESCRIPTION OF EXEMPLARY EMBODIMENTS

Figure 1:
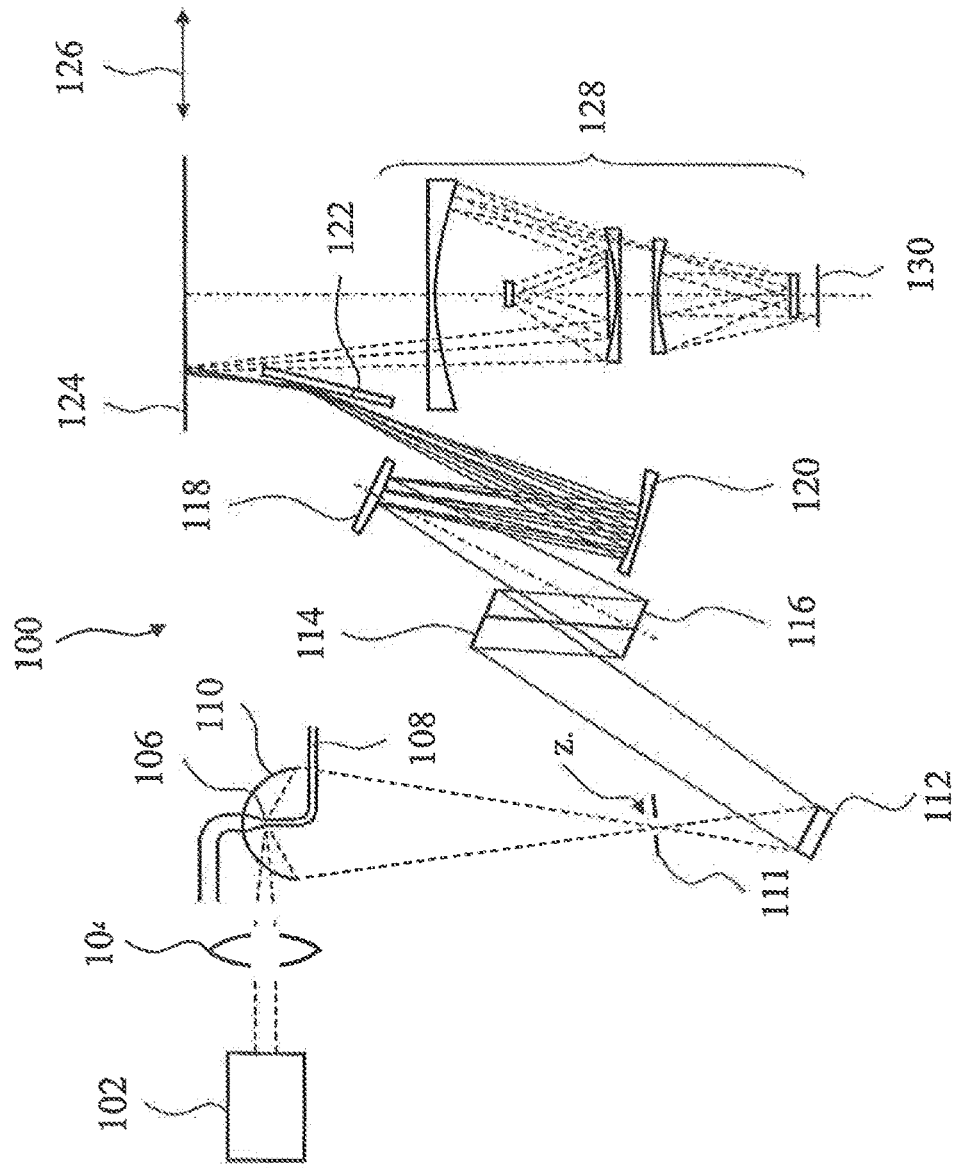
FIG. 1 shows a schematic illustration of a projection exposure apparatus.

FIG. 1 shows a schematic view of a projection exposure apparatus 100 for producing microelectronic components, for example, which is operated in a scanning mode along a scanning direction 126 with an operating wavelength in the EUV range and which can have one or more optical elements having a layer arrangement. The projection exposure apparatus 100 shown in FIG. 1 has a virtually point-type plasma radiation source. The radiation from the laser source 102 is directed via a condenser lens element 104 onto suitable material which is introduced via the feed 108 and is excited to form plasma 106. The radiation emitted by the plasma 106 is imaged by the collector mirror 110 onto the intermediate focus Z. Corresponding stops 111 at the intermediate focus Z ensure that no undesirable stray radiation impinges on the downstream mirrors 112, 114, 116, 118, 120 of the illumination system of the projection exposure apparatus 100. The plane mirror 122 serves for folding the system, in order to make available structural spaces for mechanical and electronic components in the object plane, in which the mount for the reticle 124 is arranged. In the illumination system, in the present example, the mirror 112 is followed by a field facet mirror 114 and a pupil facet mirror 116. The field facet mirror 114 serves to project a multiplicity of images of the radiation source of the projection exposure apparatus into a pupil plane, in which a second facet mirror is arranged, which serves as a pupil facet mirror 116 and superimposes the images of the facets of the field facet mirror 114 in the object plane in order to enable illumination that is as homogeneous as possible. The mirrors 118 and 120 arranged downstream of the facet mirrors 114, 116 substantially serve to shape the field in the object plane. Arranged in the object plane is a structured reticle 124, the structure of which is imaged onto the object 130 to be exposed, for instance a wafer, using a projection lens 128 having, in the present example, six mirrors. The reticle 124 is movable in the depicted direction 126 in the projection exposure apparatus 100, designed here as a scanning system, and is progressively illuminated in sections in order to project the respective structures of the reticle 124 correspondingly onto a wafer 130, for example, with the projection lens.

Figure 2:
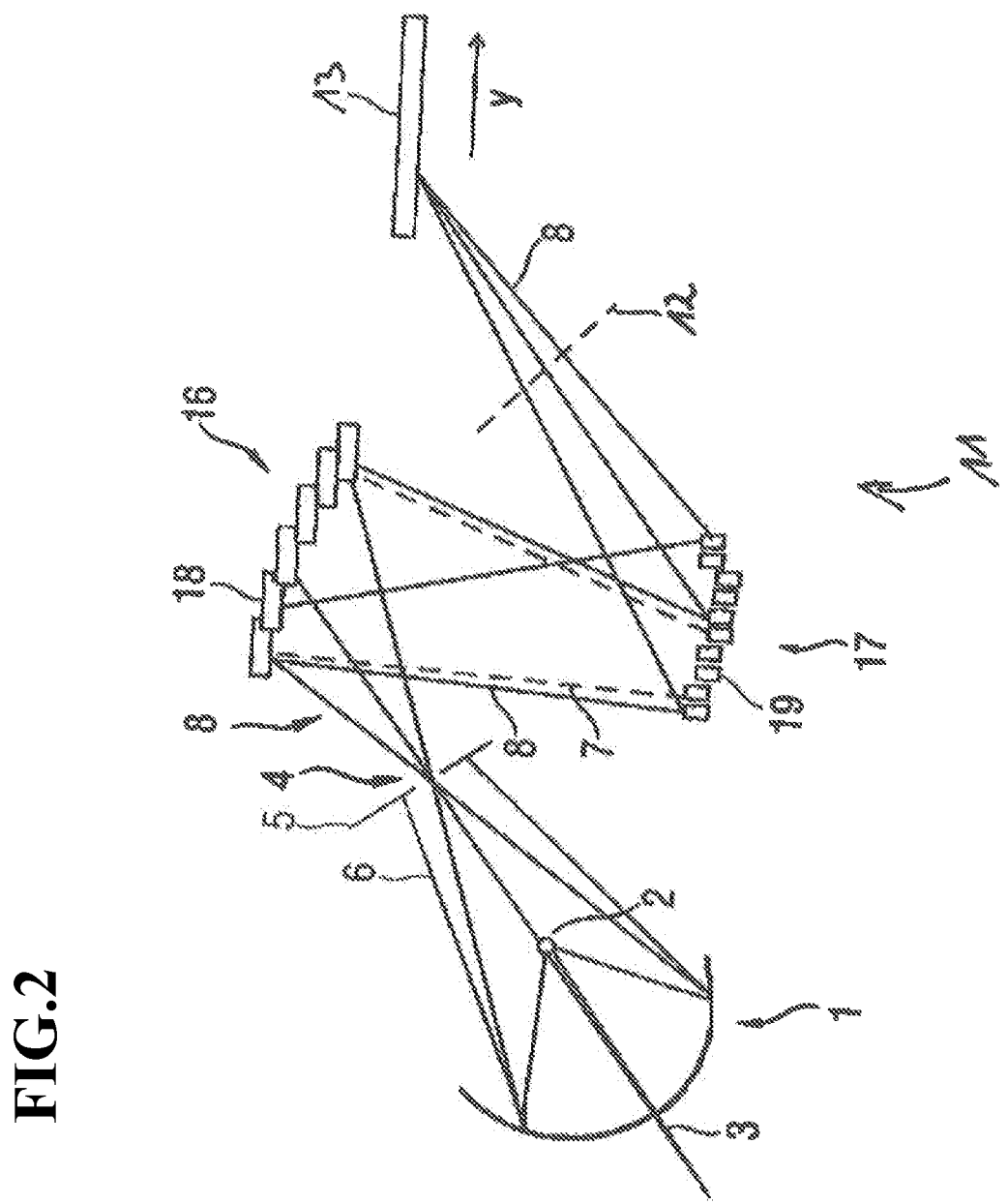
FIG. 2 shows a schematic illustration of an EUV light source and of an illumination system.

FIG. 2 illustrates a radiation source in conjunction with an illumination system 11. A collector mirror 1 doped according to the invention is arranged around a light source, which is formed by a plasma droplet 2 and is excited by an infrared laser 3. In order to obtain wavelengths in the range around 13.5 nm, for example, in the EUV wavelength range, e.g. Sn can be excited to form a plasma using a $CO_2$ laser operating at a wavelength of 10.6 µm. Instead of a $CO_2$ laser, it is also possible, for example, to use solid-state lasers. The collector mirror 1 is followed, downstream of the stop 5 at the intermediate focus 4, by a field facet mirror 16 having individual facets 18 and a pupil facet mirror 17 having individual facets 19. Before the rays impinge on the reticle 13 having the structure to be projected onto a wafer, which reticle is to be scanned in the y-direction, said rays are also deflected by a folding mirror 12. The folding mirror 12 does not have much of an optical function; rather, it serves to optimize the space requirement of the illumination system 11.

It should be pointed out that a wide variety of radiation sources can be used in EUV lithography, inter alia plasma sources which can be based for instance on laser excitation (so-called LPP sources) or gas discharge (so-called DPP sources), synchrotron radiation sources or free electron lasers (FEL). In this case, it should be taken into consideration that the LPP and DPP sources currently favored are embodied as pulsed light sources which emit the EUV light in discrete periodic light pulses of correspondingly high pulse power.

A mirror 1 according to the invention is in each case described below with reference to FIGS. 3 and 4, wherein the corresponding features of the mirrors have the same reference signs in the figures. Furthermore, the corresponding features or properties of these mirrors according to the invention will be explained subsequently in summary for FIGS. 3 and 4 after the description concerning FIG. 4.

Figure 3:
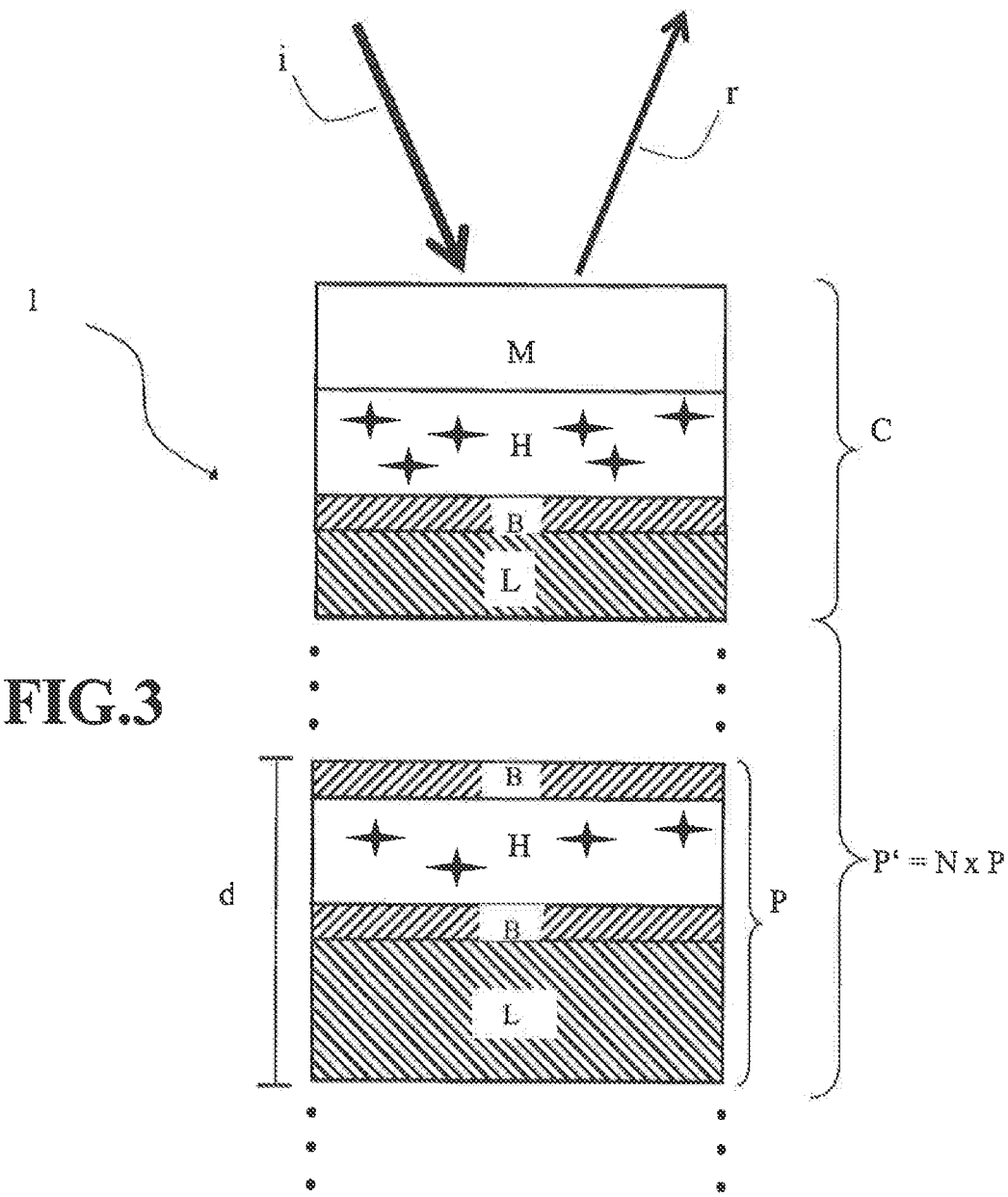
FIG. 3 shows a schematic illustration of the mirror according to the invention.

FIG. 3 shows a schematic illustration of a mirror 1 according to the invention, which mirror can be used e.g. as a collector mirror 1 in the EUV light source shown in FIG. 2 or in the projection exposure apparatus shown in FIG. 1. In FIG. 3, the mirror 1 has at least one non-metallic individual layer B, H, M which is doped with impurity atoms having a degree of doping of between 10 ppb and 10%, in particular between 100 ppb and 0.1%, such that a charge carrier density of greater than $6*10^{10}$ cm$^{-3}$ and/or an electrical conductivity of greater than $1*10^{-3}$ S/m, in particular a charge carrier density of greater than $6*10^{13}$ cm$^{-3}$ and/or an electrical conductivity of greater than 1 S/m, are/is afforded for the non-metallic individual layer B, H, M.

Such a doping is illustrated schematically by star symbols for the layers H in FIG. 3. As a result of the doping, the non-metallic individual layers can be made resistant to radiation, such that structural alterations are avoided even under high radiation loading.

By way of example, such a doping can be effected with atoms of at least one element from group V of the periodic system, in order to produce an excess of freely mobile electrons in the non-metallic individual layer. The doping can be effected not only for one but also for all of the non-metallic individual layers of a layer arrangement. This is appropriate in particular in the case of mirrors located near the EUV light source, and in this case in particular the collector mirror of the EUV light source, since said mirrors are generally subjected to very high doses of EUV radiation.

Furthermore, the doping can be effected in particular in the case of a non-metallic capping layer M, since said capping layer is subjected to the highest radiation loading within a layer arrangement. Preferably, the following materials are provided with a doping: $B_4C$, C, Zr nitrides, Zr oxides, Si, Si oxides, Si nitrides, Si carbides, Si borides, Mo nitrides, Mo carbides, Mo borides, Ru oxides, Ru nitrides, Ru carbides and Ru borides. Under EUV irradiation, these materials mentioned tend increasingly toward structural alterations that result in a spectral shift, in an increase in the surface roughness and in a change in the stress ratios. Furthermore, the doping can be used to lower the compressive stress of the layer subsystem P', such that it is possible to use either no or only a very simplified further layer subsystem for stress compensation ASL, as will be discussed in ever greater detail in connection with FIG. 4. One simple possibility for producing the doping of the non-metallic individual layer B, H, M consists in providing for a corresponding partial pressure of impurity atoms and/or using at least one correspondingly doped sputtering target during the coating of the individual layer.

Figure 4:
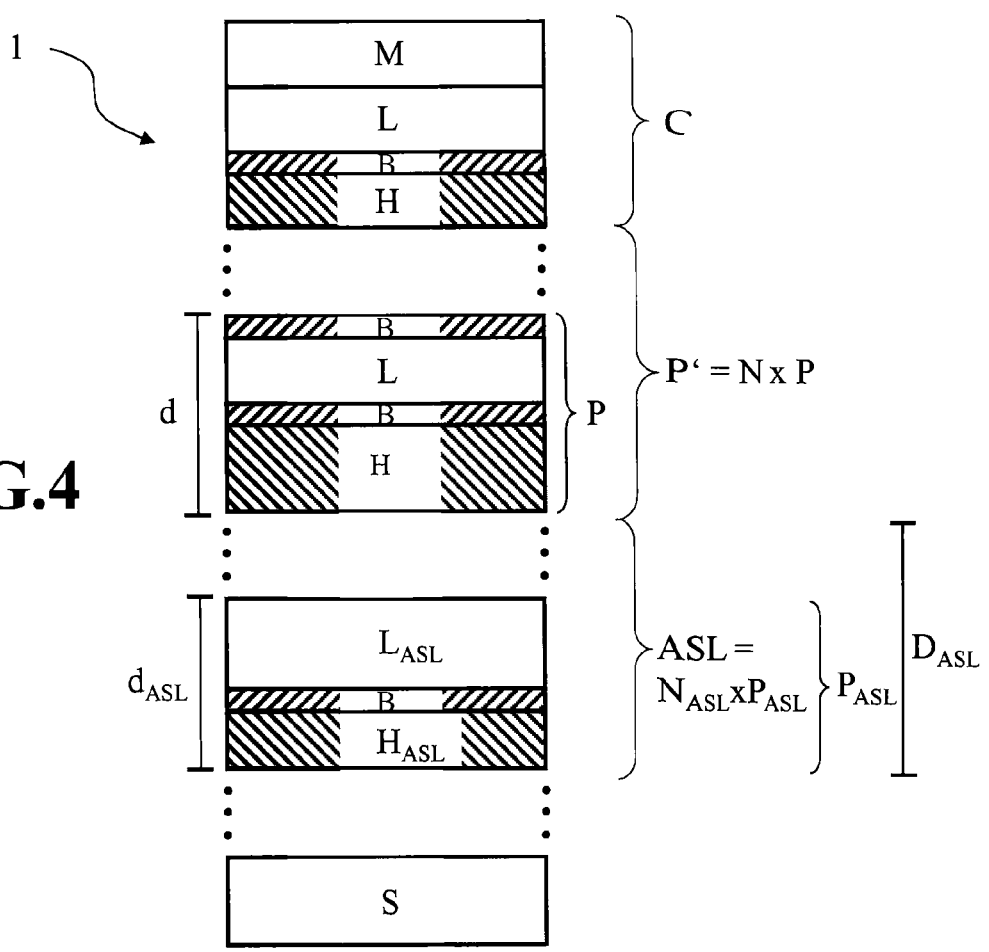
FIG. 4 shows a schematic illustration of a second mirror according to the invention.

The illustration of the layer arrangement in FIG. 3 and FIG. 4 is limited to one capping layer system C and one layer subsystem P' and respectively one further layer subsystem for stress compensation ASL, for the sake of clarity. However, the layer arrangement of a mirror 1 according to the invention can also comprise a plurality of layer subsystems P' P''', P'''', etc., which each consist of a periodic sequence of at least two periods $P_1$, $P_2$, $P_3$, etc. of individual layers, wherein the periods $P_1$, $P_2$, $P_3$, etc. comprise two individual layers composed of different materials for a high refractive index layer H', H'', H''' etc. and a low refractive index layer L', L'', L''', etc. and have within each layer subsystem P', P''', P'''', etc. a constant thickness $d_1$, $d_2$, $d_3$, etc. that deviates from a thickness of the periods of an adjacent layer subsystem.

The layers designated by H and $H_{ASL}$ in FIGS. 3 and 4 are layers composed of materials which can be designated as having a high refractive index in the EUV wavelength range in comparison with the layers of the same layer subsystem that are designated as L and $L_{ASL}$, see the complex refractive indexes of the materials in Table 1. Conversely, the layers designated by L and $L_{ASL}$ in FIGS. 3 and 4 are layers composed of materials which can be designated as having a low refractive index in the EUV wavelength range in comparison with the layers of the same layer subsystem that are designated as H and $H_{ASL}$. Consequently, the terms high refractive index and low refractive index are in the EUV wavelength range, relative terms with regard to the respective partner layer in a period of a layer subsystem. In the EUV wavelength range, layer subsystems generally function as reflective layer systems only if a layer that acts with optically high refractive index is combined with an optically lower refractive index layer relative thereto as main constituent of a period of the layer subsystem. In general, the material silicon is used for high refractive index layers. In combination with silicon, the materials molybdenum and ruthenium can be designated as low refractive index layers, see the complex refractive indexes of the materials for a wavelength of 13.5 nm in Table 1.

TABLE 1

Employed refractive indexes $\tilde{n} = n - i*k$ for 13.5 nm

| Material | Chemical Symbol | Layer Design Symbol | n | k |
|---|---|---|---|---|
| Substrate | | | 0.973713 | 0.0129764 |
| Silicon | Si | $H_{ASL}$, H | 0.999362 | 0.00171609 |
| Boron carbide | $B_4C$ | B | 0.963773 | 0.0051462 |
| Molybdenum | Mo | $L_{ASL}$, L | 0.921252 | 0.0064143 |
| Ruthenium | Ru | M, $L_{ASL}$, L | 0.889034 | 0.0171107 |
| Vacuum | | | 1 | 0 |

In the case of layer systems for microlithography having a wavelength of approximately 7 nm, generally the material LaN is used for the low refractive index layers and the material $B_4C$ is used for the high refractive index layers.

The layers $L_{ASL}$ and $H_{ASL}$ of the further layer subsystem ASL for stress compensation in FIG. 4 can correspondingly be low and high refractive index layers in the EUV wavelength range. This is not absolutely necessary, however, since the layers of the layer subsystem ASL are provided for the stress compensation of the layer arrangement and therefore do not necessarily contribute to the reflectivity of the layer arrangement.

In FIGS. 3 and 4, a barrier layer B is in each case situated between the individual layers of a period, either composed of silicon and molybdenum or composed of silicon and ruthenium, which barrier layer consists of a material which is selected or made up as a compound from the group of materials: $B_4C$, C, Si nitride, Si carbide, Si boride, Mo nitride, Mo carbide, Mo boride, Ru nitride, Ru carbide and Ru boride. Such a barrier layer suppresses the interdiffusion between the two individual layers of a period, thereby increasing the optical contrast in the transition of the two individual layers. With the use of the materials molybdenum and silicon for the two individual layers of a period, one barrier layer above the silicon layer, as viewed from the substrate, suffices in order to provide for a sufficient contrast. The second barrier layer above the molybdenum layer can be dispensed with in this case. In this respect, at least one barrier layer for separating the two individual layers of a period should be provided, wherein the at least one barrier layer may perfectly well be constructed from various ones of the above-indicated materials or the compounds thereof and may in this case also exhibit a layered construction of different materials or compounds. These statements correspondingly apply to the barrier layers in the further layer subsystem ASL for stress compensation in FIG. 4.

Barrier layers which comprise the material $B_4C$ and have a thickness of between 0.35 nm and 0.8 nm, preferably between 0.4 nm and 0.6 nm, lead in practice to high reflectivity values of the layer arrangement. Particularly in the case of layer subsystems composed of ruthenium and silicon, barrier layers composed of $B_4C$ exhibit a maximum of reflectivity in the case of values of between 0.4 nm and 0.6 nm for the thickness of the barrier layer.

In the mirrors 1 according to the invention, the number N and $N_{ASL}$ of the periods P and $P_{ASL}$ of the layer subsystems P' and ASL can comprise in each case up to 100 periods of the individual periods P and $P_{ASL}$ illustrated in FIGS. 3 and 4. In the case of layer subsystems for microlithography having a wavelength of approximately 7 nm, there can also be 250 periods. Furthermore, the layer arrangements illustrated in FIG. 3 can comprise a further layer subsystem ASL for stress compensation, as illustrated in accordance with FIG. 4, between the layer subsystem P' and the substrate, which compensates for the compressive stress of the layer subsystem P' on account of its tensile strength.

FIG. 4 shows a further layer subsystem ASL for stress compensation having the total thickness $D_{ASL}$ and having a number $N_{ASL}$ of periods $P_{ASL}$ of individual layers $L_{ASL}$, B, $H_{ASL}$ having a period thickness $d_{ASL}$, which is situated between the layer subsystem P' and the substrate S and compensates for the compressive stress of the layer subsystem P' by its tensile strength in such a way that the resulting total layer stress of the layer arrangement is less than 100 MPa, in particular less than 50 MPa, particularly preferably less than 20 MPa. In this case, the tensile stress of the further layer subsystem ASL for stress compensation, on account of the doping of the high refractive index layers of the layer subsystem P', is less than +240 MPa, thus resulting overall in a layer arrangement having a total thickness of less than 200 nm.

In FIGS. 3 and 4, the layer arrangements of the mirrors 1 according to the invention are terminated toward the vacuum by a capping layer system C comprising at least one layer composed of a chemically inert material, such as e.g. oxides, nitrides, Rh, Pt, Ru, Pd, Au, $SiO_2$, etc., as terminating layer M. Said terminating layer M thus prevents the chemical alteration of the mirror surface on account of ambient influences. The capping layer system C in FIGS. 3 and 4 consists, besides the terminating layer M, of a high refractive index layer H, a low refractive index layer L and a barrier layer B.

The thickness of one of the periods $P_{ASL}$ and P from FIGS. 3 and 4 results as the sum of the thicknesses of the individual layers of the corresponding period, i.e. from the thickness of the high refractive index layer, the thickness of the low refractive index layer and the thickness of two barrier layers. Consequently, the layer subsystems ASL and P' in FIGS. 3 and 4 can be distinguished from one another by the fact that their periods $P_{ASL}$ and P have a different thickness $d_{ASL}$ and d. Consequently, in the context of the present invention, different layer subsystems such as e.g. ASL and P' are understood to be layer subsystems whose periods $P_{ASL}$ and P differ by more than 0.1 nm in their thicknesses $d_{ASL}$ and d, since, above a difference of 0.1 nm, a different optical effect of the layer subsystems can be assumed given otherwise identical division of the periods between high and low refractive index layers. Furthermore, identical layer subsystems on different production apparatuses can fluctuate by this absolute value in their period thicknesses during their production.

The invention claimed is:

1. Mirror for the extreme ultraviolet (EUV) wavelength range having a reflectivity of greater than 40% for at least one angle of incidence of between 0° and 25°, comprising a substrate (S) and a layer arrangement,
    wherein the layer arrangement comprises at least one non-metallic individual layer (B, H, M),
    wherein the layer arrangement comprises at least one layer subsystem (P') consisting of a periodic sequence of at least two periods (P) of individual layers,
    wherein the periods (P) comprise two individual layers composed of different materials for a high refractive index layer (H) and a low refractive index layer (L),
    wherein the materials of the two individual layers (L, H) of the at least one layer subsystem (P') that form the periods (P) are either molybdenum and silicon or ruthenium and silicon,
    wherein the individual layers of the at least one layer subsystem (P') are separated by at least one barrier layer (B) and the barrier layer (B) consists of a material which is selected from the group of materials: $B_4C$, C, Si nitrides, Si carbides, Si borides, Mo nitrides, Mo carbides, Mo borides, Ru nitrides, Ru carbides and Ru borides, and
    wherein the non-metallic individual layer (B, H, M) has a doping with impurity atoms of between 10 ppb and 10%, which increases a number of free electrons in the non-metallic individual layer and provides the non-metallic individual layer (B, H, M) at least one of:
        a charge carrier density of greater than $6*10^{10}$ $cm^{-3}$ and an electrical conductivity of greater than $1*10^{-3}$ S/m.

2. Mirror for the EUV wavelength range according to claim 1, wherein the doping with impurity atoms of the at least one non-metallic individual layer (B, H, M) is effected with atoms of at least one element from group V of the periodic system.

3. Mirror for the EUV wavelength range according to claim 1, wherein the layer arrangement has a total thickness of less than 200 nm and the layers for the high refractive index layer (H) of the layer subsystem (P') have a doping with impurity atoms.

4. Mirror for the EUV wavelength range according to claim 1,
    wherein the mirror has an optically used surface which, after irradiation with light from the EUV wavelength range between 12 nm and 14 nm with a close of more than 10 $kJ/mm^2$, has an average reflection wavelength, within a reflection spectrum of the mirror, of between 12 nm and 14 nm for normal incidence such that the average reflection wavelength deviates from an average emission wavelength of the irradiation light by less than 0.25 nm.

5. Mirror for the EUV wavelength range according to claim 4,
configured as a collector mirror for an EUV light source or a mirror for an EUV illumination system, and wherein the deviation of the average reflection wavelength from the average emission wavelength is less than 0.05 nm.

6. Mirror for the EUV wavelength range according to claim 1, wherein all the individual layers composed of silicon of at least 10 of the periods of the layer subsystem (P') that are furthest from the substrate have doping with impurity atoms of between 10 ppb and 10%.

7. Mirror for the EUV wavelength range according to claim 1, wherein the surface roughness of the layer (M) terminating the layer arrangement is less than 0.2 nm rms high spatial frequency range (HSFR).

8. Mirror for the EUV wavelength range according to claim 1, wherein the layer arrangement further comprises a terminating layer (M) consisting of an oxide or nitride and having a doping with impurity atoms by atoms of at least one element from the group V of the periodic system.

9. Mirror for the EUV wavelength range according to claim 1,
wherein the layer arrangement further comprises at least one further layer subsystem (ASL) for stress compensation, wherein the further layer subsystem (ASL) consists of a periodic sequence of at least two periods ($P_{ASL}$) of individual layers, wherein the periods ($P_{ASL}$) comprise two individual layers composed of different materials for a high refractive index layer ($H_{ASL}$) and a low refractive index layer ($L_{ASL}$).

10. Mirror for the EUV wavelength range according to claim 9,
wherein the absolute value of a total layer stress of the layer arrangement is less than 100 MPa, wherein the absolute value of a tensile stress of the further layer subsystem (ASL) is less than 240 MPa, and wherein the layer subsystem (ASL) is arranged between the substrate and the at least one layer subsystem (P').

11. Mirror for the EUV wavelength range according to claim 9, wherein the further layer subsystem (ASL) has a thickness ($d_{ASL}$) of the periods ($P_{ASL}$) of 5 nm or less.

12. Mirror for the EUV wavelength range according to claim 9, wherein a reflectivity for normal incidence is more than 60% and a number ($N_{ASL}$) of the periods ($P_{ASL}$) of the further layer subsystem (ASL) is less than 20.

13. Method for coating the mirror for the EUV wavelength range according to claim 1, comprising, during coating of the at least one non-metallic individual layer (B, H, M) with a coating apparatus, a partial pressure of impurity atoms of greater than $10^{-9}$ mbar is present in the coating apparatus.

14. Method for coating a mirror for the EUV wavelength range according to claim 13, wherein the coating of the at least one non-metallic individual layer (B, H, M) is performed by magnetron sputtering at a working gas pressure of at least $10^{-4}$ mbar.

15. At least one of an EUV light source, an EUV illumination system and an EUV projection lens for microlithography comprising a mirror according to claim 1.

16. Projection exposure apparatus for microlithography comprising at least one of the EUV light source, the EUV illumination system and the EUV projection lens according to claim 15.

17. Projection exposure apparatus for microlithography, comprising an EUV light source with a collector mirror, an EUV illumination system with a further mirror, and an EUV projection lens with an additional mirror, wherein the collector mirror and at least one of the further mirror and the additional mirror is according to claim 1, wherein the collector mirror for the EUV light source has a non-metallic individual layer (B, H, M) having a doping with impurity atoms which is higher than the doping with impurity atoms of a non-metallic individual layer (B, H, M) of the further mirror or the additional mirror.

18. Projection exposure apparatus for microlithography according to claim 17, wherein the further mirror for the EUV illumination system has a non-metallic individual layer (B, H, M) having a doping with impurity atoms which is higher than the doping with impurity atoms of a non-metallic individual layer (B, H, M) of the additional mirror for the EUV projection lens of the projection exposure apparatus.

19. Mirror for the EUV wavelength range according to claim 1, wherein the non-metallic individual layer (B, H, M) has a doping with impurity atoms of between 100 ppb and 0.1%, to provide the non-metallic individual layer (B, H, M) at least one of:
a charge carrier density of greater than $6*10^{13}$ cm$^{-3}$ and an electrical conductivity of greater than 1 S/m.

20. Method for coating the mirror for the EUV wavelength range according to claim 1, comprising coating the at least one non-metallic individual layer (B, H, M) utilizing at least one sputtering target which has a doping with impurity atoms of between 10 ppb and 10%.

* * * * *

UNITED STATES PATENT AND TRADEMARK OFFICE
CERTIFICATE OF CORRECTION

PATENT NO. : 9,696,632 B2
APPLICATION NO. : 14/478535
DATED : July 4, 2017
INVENTOR(S) : Peter Huber et al.

It is certified that error appears in the above-identified patent and that said Letters Patent is hereby corrected as shown below:

In the Specification

Column 4, Line 25, Delete "close" and insert -- dose --, therefor.

Column 4, Line 38, Delete "close" and insert -- dose --, therefor.

Column 4, Line 56, Delete "close" and insert -- dose --, therefor.

Column 6, Line 10, Delete "close" and insert -- dose --, therefor.

Column 10, Line 7, Delete "P'" and insert -- P', --, therefor.

In the Claims

Column 12, Line 65, In Claim 4, delete "close" and insert -- dose --, therefor.

Signed and Sealed this
Eighth Day of September, 2020

Andrei Iancu
*Director of the United States Patent and Trademark Office*